United States Patent
Yeo et al.

(10) Patent No.: US 10,068,122 B2
(45) Date of Patent: Sep. 4, 2018

(54) CHARGE TRANSFER CIRCUIT FOR CAPACITIVE SENSING AND APPARATUS FOR DETECTING FINGERPRINT HAVING THEREOF

(71) Applicant: SENVIS CO. LTD., Osan-Si, Gyeonggi-Do (KR)

(72) Inventors: Hyeop Goo Yeo, Hwaseong-Si (KR); Seung Min Jung, Seongnam-Si (KR)

(73) Assignee: SENVIS CO. LTD. (KR)

( * ) Notice: Subject to any disclaimer, the term of this patent is extended or adjusted under 35 U.S.C. 154(b) by 0 days.

(21) Appl. No.: 15/524,623

(22) PCT Filed: Nov. 2, 2015

(86) PCT No.: PCT/KR2015/011623
§ 371 (c)(1),
(2) Date: May 4, 2017

(87) PCT Pub. No.: WO2016/076562
PCT Pub. Date: May 19, 2016

(65) Prior Publication Data
US 2017/0323134 A1    Nov. 9, 2017

(30) Foreign Application Priority Data

Nov. 10, 2014 (KR) .......... 10-2014-0155400

(51) Int. Cl.
| | |
|---|---|
| G06K 9/00 | (2006.01) |
| G01D 5/24 | (2006.01) |
| G01R 27/26 | (2006.01) |

(52) U.S. Cl.
CPC ............ G06K 9/0002 (2013.01); G01D 5/24 (2013.01); G01R 27/2605 (2013.01); G06K 9/0008 (2013.01)

(58) Field of Classification Search
CPC ............ G06K 9/0002; G06K 9/0008; G06K 9/00053; G01R 27/2605;
(Continued)

(56) References Cited

U.S. PATENT DOCUMENTS 5,543,591 A * 8/1996 Gillespie ............ G06F 3/038
178/18.03
5,963,679 A   10/1999 Setlak
(Continued)

FOREIGN PATENT DOCUMENTS

KR    20030073508 A    9/2003
KR    20040008670 A    1/2004
(Continued)

OTHER PUBLICATIONS

International Search Report for PCT/KR2015/011623, dated Feb. 29, 2016.
(Continued)

*Primary Examiner* — Manav Seth
(74) *Attorney, Agent, or Firm* — Renaissance IP Law Group LLP (57) ABSTRACT

A charge transfer circuit for capacitive sensing according to an embodiment of the present disclosure includes a variable capacitor defined through a sensor plate connected to one end of a drive line and one end of an X-drive line, an X-drive part disposed between a voltage input terminal and another end of the X-drive line opposing the variable capacitor, a switched capacitor integrator disposed between a voltage output terminal and another end of the drive line of which the one end is connected to the variable capacitor, and a shielding plate connected to a first input terminal of the switched capacitor integrator, wherein the first input terminal is connected to the other end of the drive line.

11 Claims, 9 Drawing Sheets

(58) Field of Classification Search
CPC ............ G06F 2203/04809; G01D 5/24; G01N 33/0031; G01N 27/4148; H03K 2217/960725; G11C 27/024
See application file for complete search history.

(56) References Cited

U.S. PATENT DOCUMENTS

| | | | | |
|---|---|---|---|---|
| 6,114,862 | A * | 9/2000 | Tartagni | G01B 7/004 324/661 |
| 6,225,711 | B1 * | 5/2001 | Gupta | H03K 17/962 307/125 |
| 6,362,633 | B1 * | 3/2002 | Tartagni | G01B 7/34 324/661 |
| 6,437,583 | B1 * | 8/2002 | Tartagni | G01B 7/004 324/661 |
| 6,438,257 | B1 * | 8/2002 | Morimura | G01R 27/2605 382/108 |
| 6,882,164 | B2 * | 4/2005 | Yano | G06K 9/0002 324/663 |
| 7,084,641 | B2 * | 8/2006 | Brederlow | G01N 33/48728 324/658 |
| 7,288,946 | B2 * | 10/2007 | Hargreaves | G01R 27/2605 324/678 |
| 7,705,613 | B2 * | 4/2010 | Misra | G06K 9/0002 324/662 |
| 9,864,895 | B1 * | 1/2018 | Larsson | G06K 9/0002 |
| 2001/0025532 | A1 | 10/2001 | Kramer | |
| 2004/0222803 | A1 * | 11/2004 | Tartagni | G01B 7/004 324/662 |
| 2005/0068712 | A1 * | 3/2005 | Schulz | E05B 81/78 361/287 |
| 2005/0099188 | A1 * | 5/2005 | Baxter | G01D 5/24 324/678 |
| 2008/0069413 | A1 | 3/2008 | Riedijk et al. | |
| 2014/0062957 | A1 | 3/2014 | Perski et al. | |

FOREIGN PATENT DOCUMENTS

| | | |
|---|---|---|
| KR | 20130043161 A | 4/2013 |
| KR | 20130095427 A | 8/2013 |
| KR | 101376228 B1 | 4/2014 |

OTHER PUBLICATIONS

Written Opinion for PCT/KR2015/011623, dated Feb. 29, 2016.
Extended European Search Report for Application No. 15859085.1 dated May 29, 2018.

* cited by examiner

CHARGE TRANSFER CIRCUIT FOR CAPACITIVE SENSING AND APPARATUS FOR DETECTING FINGERPRINT HAVING THEREOF

TECHNICAL FIELD

The present disclosure relates to a charge transfer technology for capacitive sensing, and more particularly, to a charge transfer circuit for capacitive sensing which is insensitive to parasitic capacitance and in which a switched capacitor integrator or an active output voltage feedback technique is used, and a fingerprint recognition device including the same.

BACKGROUND ART

A fingerprint has been most frequently used among various fields of biometrics due to a high identification rate and security, and a substantially enough amount of personal data is currently retained. Recently, with the development of an automatic fingerprint recognition technology, a fingerprint recognition system for acquiring a fingerprint in real time has been required.

As the prices of fingerprint sensors for use in such a fingerprint recognition system have been recently reduced, the fingerprint sensors are applied to not only a special security device but also peripheral devices of personal computers, such as a keyboard, a mouse, and the like, so as to be used for electronic commerce.

Therefore, in order to enter such a market, a technology for manufacturing a fingerprint sensor that is easy to use, consumes low power, and has a compact size, a low price and high definition should be secured. Researches have been conducted over the last several decades to develop a technology for electrically sensing a fingerprint. Fingerprint sensing methods proposed up to the present time may be generally classified into an optical type, a thermal type, and a capacitive type.

According to the capacitive type that is based on the principle in which capacitance varies with a distance between two electrodes, a fingerprint image may be obtained by recognizing a valley and a ridge of a fingerprint on the basis of a difference between capacitance generated between a sensing electrode and the valley of the fingerprint and capacitance generated between the sensing electrode and the ridge of the fingerprint. Since the capacitive type can be implemented using a standard complementary metal oxide semiconductor (CMOS) process technology, the capacitive type enables a simple structure of a sensor and does not require an additional device or a special process, thereby bringing about the advantages of compact size, low power consumption and low cost. However, the sensed capacitance of the ridge or the valley has a very small value such as several femto farads, and electrodes generally formed of indium tin oxide (ITO) in a touch screen panel have parasitic elements such as capacitance and resistance which may cause serious performance degradation in terms of touch sensitivity and accuracy.

DISCLOSURE

Technical Problem

The present disclosure provides a fingerprint recognition device having improved touch sensitivity over a wide dynamic range in touch devices including large parasitic elements.

The present disclosure also provides a charge transfer circuit for capacitive sensing which may be effectively used in a fingerprint recognition device having improved touch sensitivity over a wide dynamic range in touch devices including large parasitic elements.

The purposes of the present disclosure are not limited to the above-mentioned purposes, and other purposes not mentioned would be clearly understood by those skilled in the art from the disclosure below.

Technical Solution

In accordance with an exemplary embodiment, a charge transfer circuit for capacitive sensing includes: a variable capacitor defined through a sensor plate connected to one end of a drive line and one end of an X-drive line; an X-drive part disposed between a voltage input terminal and another end of the X-drive line opposing the variable capacitor; a switched capacitor integrator disposed between a voltage output terminal and another end of the drive line of which the one end is connected to the variable capacitor; and a shielding plate connected to a first input terminal of the switched capacitor integrator, wherein the first input terminal of the switched capacitor integrator is connected to the other end of the drive line.

In an embodiment, the first input terminal of the switched capacitor integrator may receive a reference voltage.

In an embodiment, the sensor plate and the shielding plate may have a parasitic capacitor therebetween.

In an embodiment, the switched capacitor integrator may include: an operational amplifier; a third switch of which one terminal is connected to the other end of the drive line and of which another terminal is connected to an inverting input terminal of the operational amplifier; a fourth switch of which one terminal is connected to the other end of the drive line and the one terminal of the third switch and of which another terminal is connected to a non-inverting input terminal of the operational amplifier and the shielding plate; a storage capacitor of which one terminal is connected to the other terminal of the third switch and the inverting input terminal of the operational amplifier and of which another terminal is connected to an output terminal of the operational amplifier; and a reset switch of which one terminal is connected to the other terminal of the third switch, the inverting input terminal of the operational amplifier, and the one terminal of the storage capacitor and of which another terminal is connected to the output terminal of the operational amplifier and the other terminal of the storage capacitor, wherein the non-inverting input terminal of the operational amplifier is connected to the other end of the drive line and the shielding plate.

In an embodiment, the X-drive part may include: a first switch configured to be turned on by a first clock signal and turned off by a second clock signal; and a second switch configured to be turned off by the first clock signal and turned on by the second clock signal.

In an embodiment, the X-drive part may include: a first switch configured to be turned on by a second clock bar signal and turned off by a first clock bar signal; and a second switch configured to be turned off by the second clock bar signal and turned on by the first clock bar signal.

In an embodiment, the first clock signal and the second clock signal may not overlap with each other.

In an embodiment, a preset voltage or a reset voltage may be applied to the voltage input terminal.

In accordance with another exemplary embodiment, a charge transfer circuit for capacitive sensing includes: a variable capacitor defined through a sensor plate connected to one end of a drive line and one end of an X-drive line; an X-drive part disposed between a voltage input terminal and another end of the X-drive line opposing the variable capacitor; an active output voltage feedback unit disposed between a voltage output terminal and another end of the drive line of which the one end is connected to the variable capacitor; and a shielding plate connected to an output terminal of the active output voltage feedback unit, wherein the output terminal of the active output voltage feedback unit opposing the one end of the drive line is connected to the other end of the drive line through a fourth switch TG2.

In an embodiment, the active output voltage feedback unit may include: a third switch and a fourth switch connected in parallel to the other end of the drive line; a buffer circuit unit connected to one terminal of the third switch opposing the drive line; a storage capacitor of which one terminal is connected between the one terminal of the third switch and an input terminal of the buffer circuit unit and of which another terminal is grounded; and a reset switch of which one terminal is connected to the one terminal of the third switch, the input terminal of the buffer circuit unit, and the storage capacitor and of which another terminal is grounded, wherein an output terminal of the buffer circuit unit opposing the third switch is connected to the other end of the drive line through a fourth switch TG2.

In an embodiment, the third switch may be turned off by a first clock signal and turned on by a second clock signal, and the fourth switch may be turned on by the first clock signal and turned off by the second clock signal.

In an embodiment, the third switch may be turned off by a second clock bar signal and turned on by a first clock bar signal, and the fourth switch may be turned on by the second clock bar signal and turned off by the first clock bar signal.

In an embodiment, the first clock signal and the second clock signal may not overlap with each other.

In an embodiment, the buffer circuit unit may be an operational amplifier.

In an embodiment, a non-inverting input terminal of the operational amplifier may be connected to the one terminal of the third switch, and an inverting input terminal of the operational amplifier may be connected between an output terminal of the operational amplifier and the fourth switch.

In accordance with another exemplary embodiment, a fingerprint recognition device includes: a charge transfer circuit for capacitive sensing, the charge transfer circuit including: a variable capacitor defined through a sensor plate connected to one end of a drive line and one end of an X-drive line; an X-drive part disposed between a voltage input terminal and another end of the X-drive line opposing the variable capacitor; a switched capacitor integrator disposed between a voltage output terminal and another end of the drive line of which the one end is connected to the variable capacitor; and a shielding plate connected to a first input terminal of the switched capacitor integrator, wherein the first input terminal of the switched capacitor integrator is connected to the other end of the drive line; and a bezel of which one end is connected to the one end of the X-drive line and of which another end is directly contactable by a finger.

In accordance with another exemplary embodiment, a fingerprint recognition device includes: a charge transfer circuit for capacitive sensing, the charge transfer circuit including: a variable capacitor defined through a sensor plate connected to one end of a drive line and one end of an X-drive line; an X-drive part disposed between a voltage input terminal and another end of the X-drive line opposing the variable capacitor; an active output voltage feedback unit disposed between a voltage output terminal and another end of the drive line of which the one end is connected to the variable capacitor; and a shielding plate connected to an output terminal of the active output voltage feedback unit, wherein the output terminal of the active output voltage feedback unit opposing the one end of the drive line is connected to the other end of the drive line through a fourth switch TG2; and a bezel of which one end is connected to the one end of the X-drive line and of which another end is directly contactable by a finger.

In an embodiment, the bezel may be made of metal or conductive polymers.

In accordance with another exemplary embodiment, a fingerprint recognition device includes: a charge transfer circuit for capacitive sensing, the charge transfer circuit including: a variable capacitor defined through a sensor plate connected to one end of a drive line and one end of an X-drive line; an X-drive part disposed between a voltage input terminal and another end of the X-drive line opposing the variable capacitor; a switched capacitor integrator disposed between a voltage output terminal and another end of the drive line of which the one end is connected to the variable capacitor; and a shielding plate connected to a first input terminal of the switched capacitor integrator, wherein the first input terminal of the switched capacitor integrator is connected to the other end of the drive line; and a top metal of which one end is connected to the one end of the X-drive line and of which another end is contactable by a finger through a passivation layer.

In accordance with another exemplary embodiment, a fingerprint recognition device includes: a charge transfer circuit for capacitive sensing, the charge transfer circuit including: a variable capacitor defined through a sensor plate connected to one end of a drive line and one end of an X-drive line; an X-drive part disposed between a voltage input terminal and another end of the X-drive line opposing the variable capacitor; an active output voltage feedback unit disposed between a voltage output terminal and another end of the drive line of which the one end is connected to the variable capacitor; and a shielding plate connected to an output terminal of the active output voltage feedback unit, wherein the output terminal of the active output voltage feedback unit opposing the one end of the drive line is connected to the other end of the drive line through a fourth switch TG2; and a top metal of which one end is connected to the one end of the X-drive line and of which another end is contactable by a finger through a passivation layer.

In an embodiment, the top metal may be spaced apart from another top metal so that the one end of the top metal is only connected to the one end of the X-drive line and the other end of the top metal is contactable by the finger through the passivation layer.

In accordance with another exemplary embodiment, a fingerprint sensing method includes: receiving capacitances of a ridge and a valley of a fingerprint; integrating the received capacitances according to a variable clock; sampling or holding the integrated capacitances; converting the sampled or held capacitances into digital values; and determining whether a fingerprint part is the ridge or the valley on the basis of the digital values converted according to a difference in the capacitances of the ridge and the valley.

In an embodiment, the integrating the received capacitances according to the variable clock may be discrete-time integrating.

Advantageous Effects

As described above, according the present disclosure, a charge transfer circuit for capacitive sensing includes a switched capacitor integrator or an active output voltage feedback unit, and thus may minimize the parasitic effects caused by parasitic elements. Accordingly, the present disclosure may provide a charge transfer circuit for capacitive sensing which has improved touch sensitivity over a wide dynamic range and a fingerprint recognition device including the same.

BEST MODE

Specific structures or operations described herein are only intended to describe embodiments of the present disclosure. However, the embodiments of the present disclosure may be implemented in various forms, and should not be construed as being limited to the embodiments described herein.

The present invention may be variously modified and may have various forms. However, particular embodiments are exemplarily illustrated in the drawings and are described in detail below. However, it should be understood that the present invention is not limited to specific forms, but rather cover all modifications, equivalents or alternatives that fall within the spirit and scope of the present invention.

The terms "first", "second" and the like may be used for describing various elements, but the elements should not be construed as being limited by the terms. Such terms are only used for distinguishing one element from other elements. For example, without departing the scope of the present invention, a first element may be referred to as a second element, and, likewise, a second element may be referred to as a first element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other terms for describing relationships among elements, such as "between", "directly between", "adjacent to", "directly adjacent to", and the like, should be interpreted in the same manner.

The terminology used herein is not for delimiting the present invention but for describing specific embodiments. The terms of a singular form may include plural forms unless otherwise specified. It will be further understood that the terms "comprise", "comprising,", "include", "including", "have" or "having", when used herein, specify the presence of stated features, numbers, steps, operations, elements, components or combinations thereof, but do not preclude the presence or addition of one or more other features, numbers, steps, operations, elements, components or combinations thereof.

The terms used herein, including technical or scientific terms, have the same meanings as understood by those skilled in the art. Terms in common usage such as those defined in commonly used dictionaries should be interpreted as is customary in the relevant art, but should not be interpreted in an idealized or overly formal sense unless otherwise defined herein.

In the case where some embodiments can be differently implemented, functions or operations described with respect to specific blocks may be performed in a different sequence from that described in a flowchart. For example, two successive blocks may be operated substantially at the same time, or may be operated reversely depending on related functions or operations.

Preferred embodiments of the present disclosure are described below with reference to the accompanying drawings.

Figure 1:
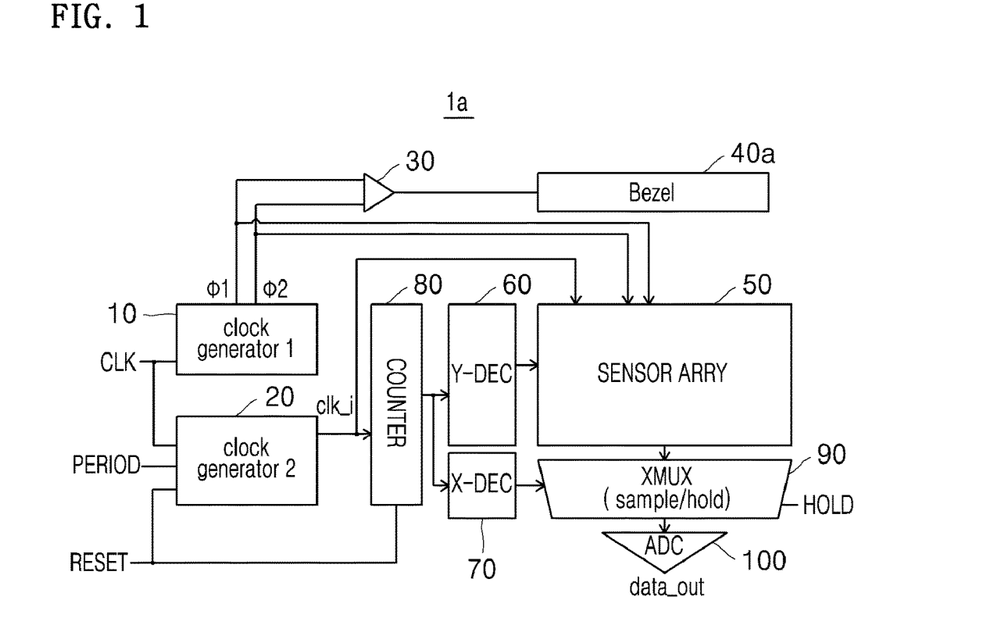
FIG. 1 is a block diagram illustrating a fingerprint recognition device according to an embodiment of the present disclosure.
Figure 2:
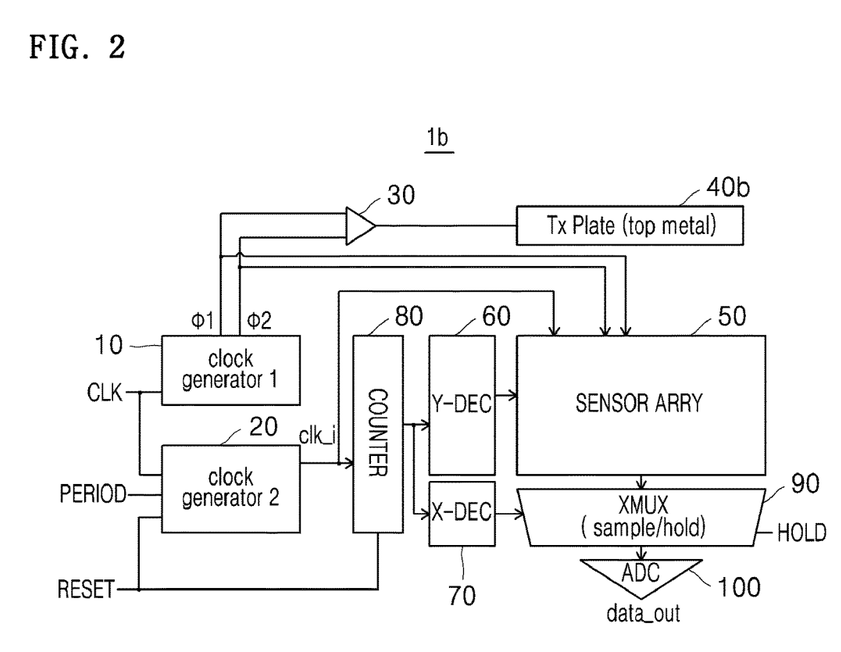
FIG. 2 is a block diagram illustrating a fingerprint recognition device according to another embodiment of the present disclosure.
Figure 3:
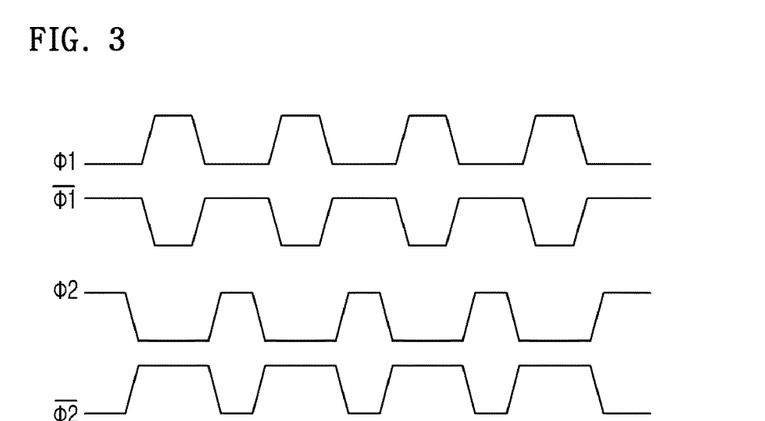
FIG. 3 illustrates switch control signals applied to the fingerprint recognition device illustrated in FIG. 1 or 2.

FIG. 1 is a block diagram illustrating a fingerprint recognition device 1a according to an embodiment of the present disclosure. FIG. 2 is a block diagram illustrating a fingerprint recognition device 1b according to another embodiment of the present disclosure. FIG. 3 illustrates switch control signals applied to the fingerprint recognition device 1a or 1b illustrated in FIG. 1 or 2.

Referring to FIG. 1, the fingerprint recognition device 1a may include a first clock generator 10, a second clock generator 20, a bezel driver 30, a bezel 40a, a sensor cell array 50, a Y-drive part 60, an X-drive part 70, a counter 80, an X-multiplexer (XMUX) 90, and an analog-to-digital converter (ADC) 100.

The first clock generator 10 may generate a first clock signal $\Phi 1$ and/or a second clock signal $\Phi 2$ in synchronization with a system clock CLK. Furthermore, the first clock generator 10 may generate a first clock bar signal $\overline{\phi}1$ and/or a second clock bar signal $\overline{\phi}2$.

Here, as illustrated in FIG. 3, the first and second clock signals $\Phi 1$ and $\Phi 2$ may not overlap with each other. The first clock bar signal $\overline{\phi}1$ is an inverted version of the first clock signal Φ1, and the second clock bar signal $\overline{\phi 2}$ is an inverted version of the second clock signal Φ2.

The second clock generator 20 may generate, on the basis of the system clock CLK, a signal clk_i that is a reset/evaluation pulse having a variable period, and may generate various periods according to a signal PERIOD. The second clock generator 20 receives a signal RESET initially to start to operate.

The bezel driver 30 may receive the first clock signal Φ1 and/or the second clock signal Φ2 to output a signal for driving the bezel. Furthermore, the bezel driver 30 may receive the first clock bar signal $\overline{\phi 1}$ and/or the second clock bar signal $\overline{\phi 2}$ to output a signal for driving the bezel.

The bezel 40a may be used to directly apply a power input signal to a finger. The bezel 40a may be made of metal, conductive polymers, or electrically conductive objects. As described below, a method in which an operation is performed by directly contacting a finger through the bezel 40a is referred to as a direct method.

The sensor cell array 50 may be a plurality of sensor plates arranged in a matrix with a unit of one pixel, and may detect capacitance generated according to whether a contacted fingerprint part is a ridge or a valley.

The Y-drive part 60 may sequentially select and drive sensor cells arranged in each row of the sensor cell array 50. The X-drive part 70 may sequentially select and drive sensor cells arranged in each column of the sensor cell array 50.

The counter 80 may sequentially activate each sensor cell by increasing values of each row and each column of the sensor cell array 50 in order to detect capacitance of each sensor cell generated from a contacted fingerprint.

The X-multiplexer 90 may sample/hold, according to an input signal HOLD, a capacitance value sensed from a sensor cell of one pixel selected from the sensor cell array 50. The ADC 100 may convert the capacitance value sampled/held by the X-multiplexer 90 into a digital value.

A microprocessor, a central processing unit (CPU), an application processor (AP), or the like disposed in the inside or the outside may determine whether the fingerprint part is a ridge or a valley according to the capacitance value converted into the digital value.

FIG. 2 is a block diagram illustrating the fingerprint recognition device 1b according to another embodiment of the present disclosure. The same elements as described above are referred to by the same reference numerals, and detailed descriptions of the same elements are omitted below.

The fingerprint recognition device 1b illustrated in FIG. 2 is different from the fingerprint recognition device 1a in that an electrode for applying a power input signal is replaced with a Tx plate 40b which is a top metal of a chip, whereas the bezel 40a is used as an electrode in the fingerprint recognition device 1a. As described below, a method in which a finger is allowed to contact a Tx plate through a passivation layer so as to perform an operation is referred to as a pseudo-direct method.

Figure 4:
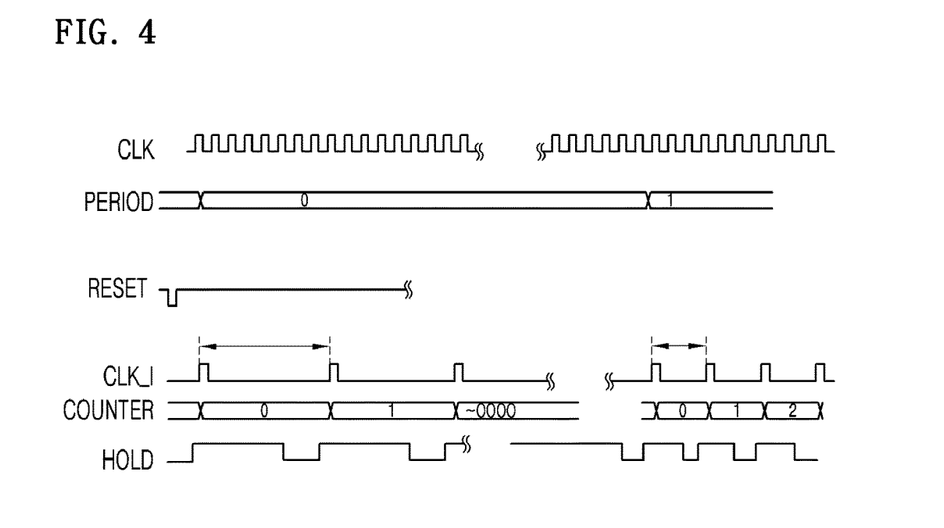
FIG. 4 is a timing diagram of fingerprint recognition devices according to embodiments of the present disclosure.

FIG. 4 is a timing diagram illustrating operations of the fingerprint recognition devices 1a and 1b according to the embodiments of the present disclosure.

Referring to FIG. 4, when a signal RESET at a low level is applied to the fingerprint recognition device 1a or 1b, the fingerprint recognition device 1a or 1b starts to operate. The signal PERIOD is increased by 1 at an interval of one period.

The signal CLK_I may be generated so as to have a variable period by the second clock generator 20 in response to the system clock CLK and/or the signal PERIOD, and may be input to each sensor cell of the sensor cell array 50 to generate a reset/evaluation pulse. Here, a reset signal may be a precharge signal. Furthermore, the signal CLK_I may be input to the counter 80.

When the signal CLK_I is at a high level, a selected sensor cell may be precharged, and, when the signal CLK_I is at a low level, the capacitance value of the selected sensor cell may be output.

During one period of the signal CLK_I, a voltage value according to the capacitance value of each sensor cell may be sampled/held if the signal HOLD is at a low level.

Figure 5:
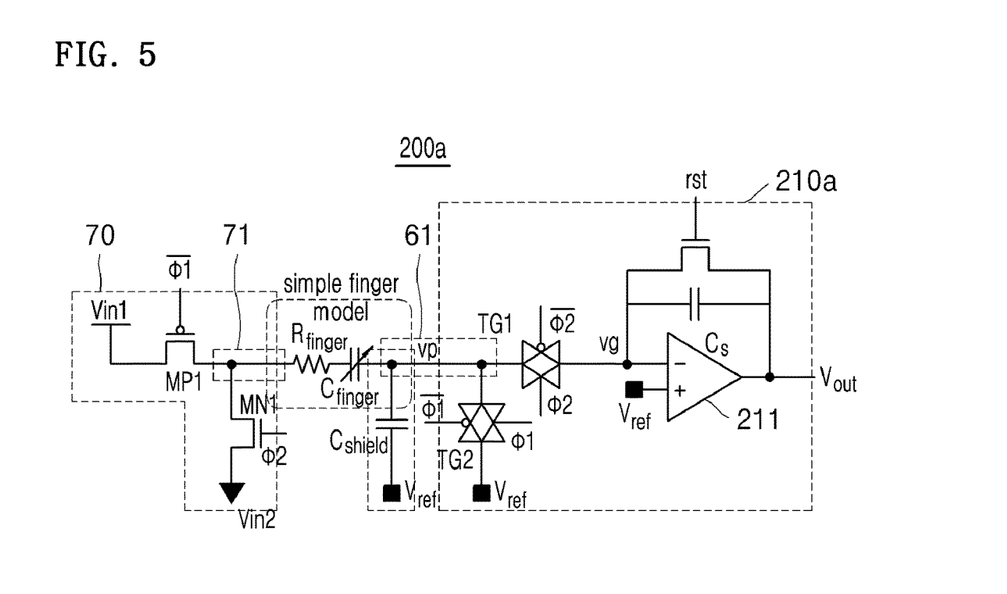
FIG. 5 is a circuit diagram of a charge transfer circuit for capacitive sensing according to an embodiment of the present disclosure included in fingerprint recognition devices according to embodiments of the present disclosure.
Figure 6:
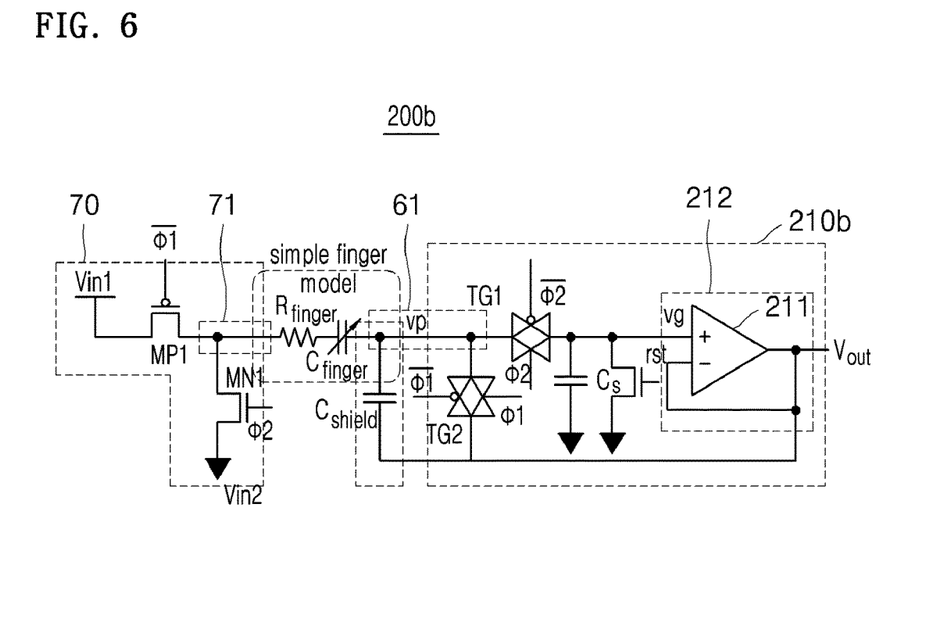
FIG. 6 is a circuit diagram of a charge transfer circuit for capacitive sensing according to another embodiment of the present disclosure included in fingerprint recognition devices according to embodiments of the present disclosure.

FIG. 5 is a circuit diagram of a charge transfer circuit 200a for capacitive sensing according to an embodiment included in the fingerprint recognition device 1a or 1b, and FIG. 6 is a circuit diagram of a charge transfer circuit 200b for capacitive sensing according to another embodiment included in the fingerprint recognition device 1a or 1b.

Figure 7:
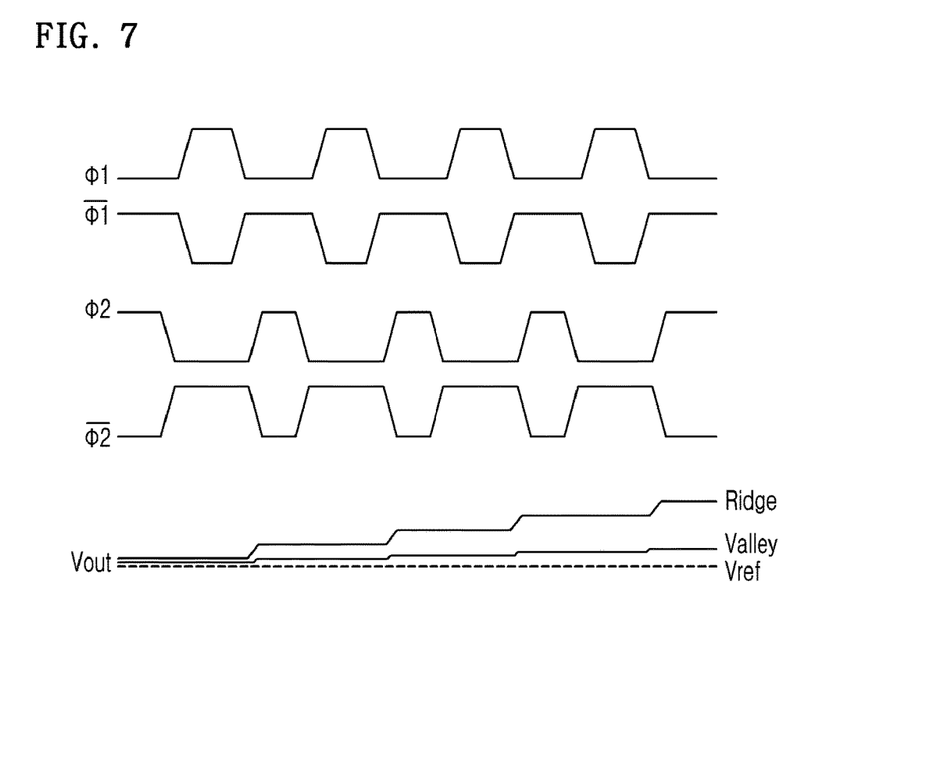
FIG. 7 is a timing diagram illustrating switch control signals applied to charge transfer circuits for capacitive sensing according to embodiments of the present disclosure and an output voltage according to a ridge and a valley of a fingerprint.

FIG. 7 is a timing diagram illustrating switch control signals applied to the charge transfer circuit 200a or 200b for capacitive sensing and an output voltage Vout according to a ridge and a valley of a fingerprint.

Referring to FIG. 5, the charge transfer circuit 200a for capacitive sensing may include an X-drive part 70, an X-drive line 71, a drive line 61, a variable capacitor Cfinger and a parasitic resistor Rfinger defined between the X-drive line 71 and the drive line 61, a parasitic capacitor Cshield generated between a shielding plate (metal shielding) and a sensor plate described below, and a switched capacitor integrator 210a.

A first switch MP1 and a fourth switch TG2 may be turned on or off by the first clock signal Φ1 and the first clock bar signal $\overline{\phi 1}$. A second switch MN1 and a third switch TG1 may be turned on or off by the second clock signal Φ2 and the second clock bar signal $\overline{\phi 2}$.

The parasitic resistor Rfinger and the variable capacitor Cfinger connected to each other in series may represent simple modeling of a contacted finger.

The X-drive part 70 may be disposed between one end of the X-drive line 71 which opposes the variable capacitor Cfinger and a voltage input terminal Vin1. The X-drive part 70 may include the first switch MP1 and the second switch MN1.

The first switch MP1 may be disposed between one end of the X-drive line 71 which opposes the variable capacitor Cfinger and the voltage input terminal Vin1. One terminal of the second switch MN1 may be connected to the one end of the X-drive line 71 which opposes the variable capacitor Cfinger, and another terminal of the second switch MN1 may be connected to a ground.

A preset voltage VDD or GND or a reset voltage may be applied to the voltage input terminal Vin1 and/or the ground. Here, the reset voltage may represent that a bias may be differently established to obtain a desired degree of charge transfer. For example, a first power supply voltage Vin1 and/or a second power supply voltage Vin2 may be input to the voltage input terminal Vin1 and/or the ground.

Referring to FIG. 7, the first clock signal Φ1 and the second clock signal Φ2 may adjust the output voltage Vout of the switched capacitor integrator 210a and switches together with the first clock bar signal $\overline{\phi 1}$ and the second clock bar signal $\overline{\phi 2}$.

As illustrated in FIG. 7, the first and second clock signals Φ1 and Φ2 may not overlap with each other. The first clock bar signal $\overline{\phi 1}$ is an inverted version of the first clock signal Φ1, and the second clock bar signal $\overline{\phi 2}$ is an inverted version of the second clock signal Φ2.

Referring back to FIG. 5, as described below, the parasitic capacitor Cshield may be generated between the sensor plate connected to the drive ling 61 and the shielding plate (metal shielding) for blocking a noise generated by a circuit under the sensor plate to improve a touch sensitivity. The circuit under the sensor plate may include the switched capacitor integrator 210a, an active output voltage feedback unit 210b, or other circuits. Here, the other circuits may not related to an operation of extracting the variable capacitor Cfinger from a finger.

The switched capacitor integrator 210a may be disposed between the voltage output terminal Vout and the other end of the drive line 61 connected to one terminal of the variable capacitor Cfinger.

The switched capacitor integrator 210a may include the third switch TG1 of which one terminal is connected to the fourth switch TG2 and the driving line 61 and of which another terminal is connected to an inverting input terminal of an operational amplifier 211, the fourth switch TG2 of which one terminal is connected to the drive line 61 and of which another terminal is connected to a reference voltage input terminal Vref, and the operational amplifier 211 of which the inverting input terminal is connected to the other terminal of the third switch TG1 and of which a non-inverting input terminal receives a reference voltage Vref.

Furthermore, the switched capacitor integrator 210a may include a storage capacitor Cs of which one terminal is connected to the other terminal of the third switch TG1 and the inverting terminal of the operational amplifier 211 and of which another terminal is connected to the voltage output terminal Vout, and a reset switch rst of which one terminal is connected to the other terminal of the third switch TG1, the inverting terminal of the operational amplifier 211, and the one terminal of the storage capacitor Cs and of which another terminal is connected to the voltage output terminal Vout and the other terminal of the storage capacitor Cs.

In general, charges flow from a high-voltage side to a low-voltage side until voltages of both the sides are equalized. Therefore, it may be required to charge the parasitic capacitor Cshield so that a voltage vp of the drive line 61 is equal to a voltage vg of the inverting input terminal of the operational amplifier 211, in order to avoid the parasitic effect of the parasitic capacitor Cshield generated between the shielding plate (metal shielding) and the sensor plate connected to the drive line 61 as described below, when charges are transferred from the variable capacitor Cfinger to the storage capacitor Cs.

When the first clock signal Φ1 is turned on, an output node of the parasitic capacitor Cshield is charged with the reference voltage Vref. The inverting input terminal of the operational amplifier 211 is virtually short-circuited with the non-inverting input terminal to which the reference voltage Vref is input.

Therefore, when charges are transferred from the variable capacitor Cfinger to the storage capacitor Cs, the output node voltage vp of the drive line 61 is equal to the inverting input node voltage vg of the operational amplifier 211, and thus no charges are transferred from the parasitic capacitor Cshield to the storage capacitor Cs. As a result, charges stored in the parasitic capacitor Cshield of the drive line 61 are unable to affect an output voltage, and the parasitic effect of the parasitic capacitor Cshield of the drive line 61 may be avoided.

A transfer function of the charge transfer circuit 200 for capacitive sensing according to an embodiment of the present disclosure is expressed as Equation 1.

$$H(z) = \frac{C_f}{C_s} \cdot \frac{1}{z-1}$$ (Equation 1)

Where z denotes a parameter of z-transform, Cf denotes a capacitance of the variable capacitor Cfinger, and Cs denotes a capacitance of the storage capacitor Cs.

The storage capacitor Cs may integrate charges transferred from the variable capacitor Cfinger at a rising time of the second clock signal Φ2. Here, a gradient of an integral value varies with a capacitance value of the variable capacitor Cfinger. The capacitance value of the variable capacitor Cfinger is high at a ridge and is low at a valley.

Therefore, as illustrated in FIG. 7, the output voltage Vout of the operational amplifier 211 which starts from the reference voltage Vref more increases at a ridge than at a valley as the number of clocks increases.

FIG. 6 is a circuit diagram of the charge transfer circuit 200b for capacitive sensing according to another embodiment of the present disclosure included in the fingerprint recognition device 1a or 1b. The same elements as described above are referred to by the same reference numerals, and detailed descriptions of the same elements are omitted below.

Differences between the charge transfer circuit 200b for capacitive sensing of FIG. 6 and the above-mentioned charge transfer circuit 200a for capacitive sensing are described below.

The non-inverting input terminal of the operation amplifier 211 included in the active output voltage feedback unit 210b may be connected to each one terminal of the third switch TG1, the storage capacitor Cs, and the reset switch rst, and the other terminals of the storage capacitor Cs and the reset switch rst may be connected to the ground. The other terminal of the third switch TG1 may be connected to one terminal of the fourth switch TG2 and one terminal of the parasitic terminal Cshield.

A buffer circuit unit 212 may be a voltage follower in which the inverting input terminal of the operational amplifier 211 is connected to the output terminal thereof.

The inverting input terminal of the operational amplifier 211 may be connected to the output terminal thereof and the other terminals of the parasitic capacitor Cshield and the fourth switch TG2. Accordingly, the output voltage Vout may be supplied to the voltage follower and may be fed back to the fourth switch TG2 and the parasitic capacitor Cshield, thereby preventing charges from being transferred from the parasitic capacitor Cshield. When the first clock signal Φ1 is at a high level at which the first switch MP1 and the fourth switch TG2 are turned on, the parasitic capacitor Cshield may be charged such that the voltage vp of the drive line 61 is equalized to the input terminal voltage vg of the buffer circuit by a feedback output voltage generated by the voltage follower of the input terminal of the buffer circuit including the operational amplifier 211. As a result, the charges stored in the parasitic capacitor Cshield are unable to affect the output voltage. A circuit for performing such operations is referred to as the active output voltage feedback unit 210b in the present disclosure.

Figure 8:
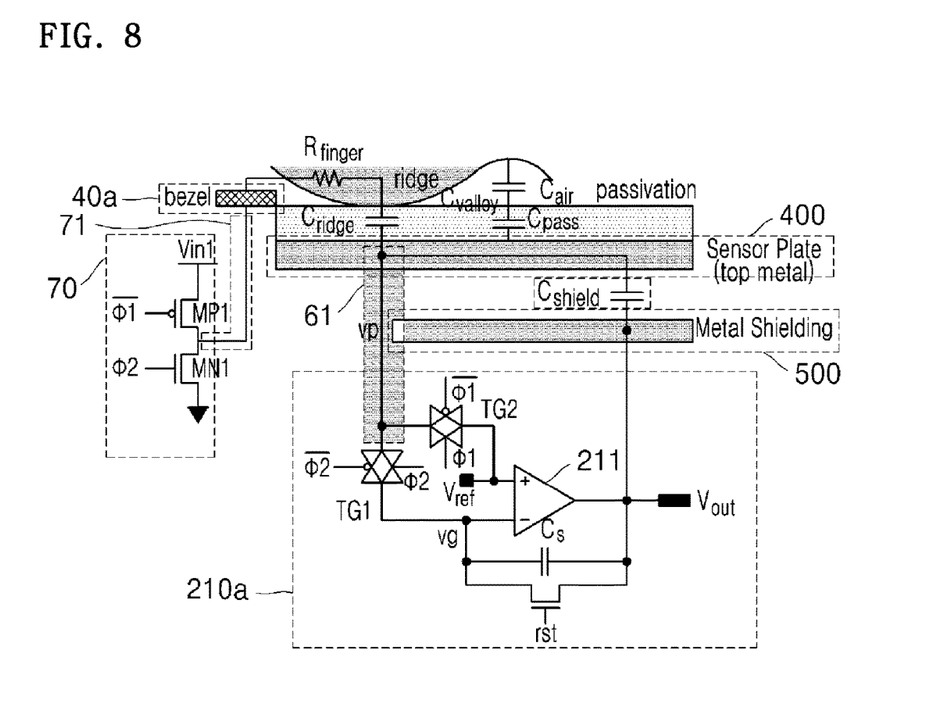
FIG. 8 is a schematic diagram illustrating a situation in which the charge transfer circuit for capacitive sensing of FIG. 5 is used in the fingerprint recognition device based on a direct method of FIG. 1.

FIG. 8 is a schematic diagram illustrating a situation in which the charge transfer circuit 200a for capacitive sensing of FIG. 5 is used in the fingerprint recognition device 1a based on the direct method of FIG. 1.

Referring to FIG. 8, the first clock bar signal $\overline{\Phi}1$ is an inverted version of the first clock signal Φ1, and the second clock bar signal $\overline{\Phi}2$ is an inverted version of the second clock signal Φ2. The first switch MP1 is a P-channel metal-oxide semiconductor (PMOS) transistor, and the second switch MN1 is an N-channel MOS (NMOS) transistor. The third switch TG1 and the fourth switch TG2 are transmission gates in which a PMOS transistor and an NMOS transistor are connected to each other in parallel. The first switch MP1 and the fourth switch TG2 may be turned on or off by the first clock signal Φ1 or the first clock bar signal $\overline{\phi}1$. The second switch MN1 and the third switch TG1 may be turned on or off by the second clock signal Φ2 or the second clock bar signal $\overline{\phi}2$.

A shielding plate (metal shielding) 500 may block a noise generated by a circuit under a sensor plate 400, thereby improving the touch sensitivity. The circuit under the sensor plate may include the switched capacitor integrator 210a or other circuits not related to an operation of extracting the variable capacitor Cfinger from a finger.

Here, the parasitic capacitor Cshield may be generated between the sensor plate 400 and the shielding plate 500. For example, the parasitic capacitor Cshield may have a value between several tens of fF and several hundreds of fF according to a sensor cell size.

As described above with reference to FIG. 5, it may be required for the active output voltage feedback unit 210b to charge the parasitic capacitor Cshield so that the voltage vp of the drive line 61 is equal to the voltage vg of the inverting input terminal of the operational amplifier 211, in order to avoid the parasitic effect of the parasitic capacitor Cshield generated between the shielding plate (metal shielding) and the sensor plate connected to the drive line 61.

When the first clock signal Φ1 is turned on, the output node of the parasitic capacitor Cshield is charged with the reference voltage Vref. The inverting input terminal of the operational amplifier 211 is virtually short-circuited with the non-inverting input terminal to which the reference voltage Vref is input.

Therefore, when charges are transferred from the variable capacitor Cfinger to the storage capacitor Cs, the output node voltage vp of the drive line 61 is equal to the inverting input node voltage vg of the operational amplifier 211, and thus the parasitic effect of the parasitic capacitor Cshield may be avoided.

The bezel 40a may contact a finger to directly apply the power input signal Vin1 or Vin2. As described above, the method in which an operation is performed by directly contacting a finger through the bezel is referred to as the direct method.

The bezel 40a may be made of metal, conductive polymers, or electrically conductive objects.

As illustrated in FIG. 8, a finger may be simply modeled as the variable capacitor Cfinger and the parasitic resistor Rfinger connected to each other in series. Here, the variable capacitor Cfinger may be a ridge capacitor Cridge or a valley capacitor Cvalley.

The sensor plate 400 may be separated from a finger by a passivation layer. Therefore, the finger capacitor Cfinger may include an air capacitor Cair between a chip surface and a finger skin and a passivation layer capacitor Cpass between the sensor plate and the chip surface, which are connected to each other in series.

The power input signal Vin1 or Vin2 driven by a driver of the X-drive part 70 is directly introduced to a finger via a bezel contact.

Charges accumulated in the finger capacitor Cfinger may be transferred to the storage capacitor Cs. The finger capacitor Cfinger may have different values depending on the ridge capacitor Cridge or the valley capacitor Cvalley.

The valley capacitor Cvalley corresponds to the air capacitor Cair between a chip surface and a finger skin and the passivation layer capacitor Cpass between the sensor plate 400 and the chip surface, which are connected to each other in series, whereas the ridge capacitor Cridge corresponds to the passivation layer capacitor Cpass between the sensor plate 400 and the chip surface. This may be expressed as an equation as below.

$$C_{ridge} = C_{pass} \quad \text{(Equation 2)}$$

$$C_{valley} = \frac{C_{air} \cdot C_{pass}}{C_{air} + C_{pass}} \quad \text{(Equation 3)}$$

A variation of the finger capacitor Cfinger defined as a difference between the ridge capacitor Cridge and the valley capacitor Cvalley may be expressed as an equation as below.

$$\Delta C_{finger} = C_{ridge} - C_{valley} \quad \text{(Equation 4)}$$

The parasitic capacitor Cshield generated between the sensor plate 400 and the shielding plate 500 may be electrically connected to one terminal of the fourth switch TG2 and the non-inverting input terminal of the operational amplifier 211. Here, the reference voltage Vref may be input to the non-inverting input terminal.

Therefore, when the fourth switch TG2 is turned on, a voltage of the sensor plate 400 is equalized to a voltage of the shielding plate 500 by the reference voltage Vref input to the non-inverting input terminal of the operational amplifier 211, and thus the parasitic capacitor Cshield may be effectively removed from the drive line 61. Therefore, the output voltage Vout per single charge transfer of the charge transfer circuit for capacitive sensing of the present disclosure may be expressed as below.

$$V_{out}(t) \cong -\frac{C_{finger}}{C_{finger} + C_s} V_{dd} \quad \text{(Equation 5)}$$

Where the capacitor Cfinger is the ridge capacitor Cridge or the valley capacitor Cvalley. A transfer function with a parameter z may be defined as below.

$$H(Z) = -\frac{C_{finger}}{C_{finger} + C_s} \frac{1}{Z-1} \quad \text{(Equation 6)}$$

Output voltages of the ridge capacitor Cridge and the valley capacitor Cvalley may be obtained from Equation 5, and a difference between the output voltages of the ridge capacitor Cridge and the valley capacitor Cvalley may be defined as below.

$$V_{diff} = \left(\frac{C_{ridge}}{C_{ridge} + C_s} - \frac{C_{valley}}{C_{valley} + C_s}\right) V_{dd} \quad \text{(Equation 7)}$$

As a result, a sense voltage Vsense which is the difference between the output voltages of the ridge capacitor Cridge and the valley capacitor Cvalley is defined as below after nth integration.

$$V_{sense} = n \cdot V_{diff} \quad \text{(Equation 8)}$$

Figure 9:
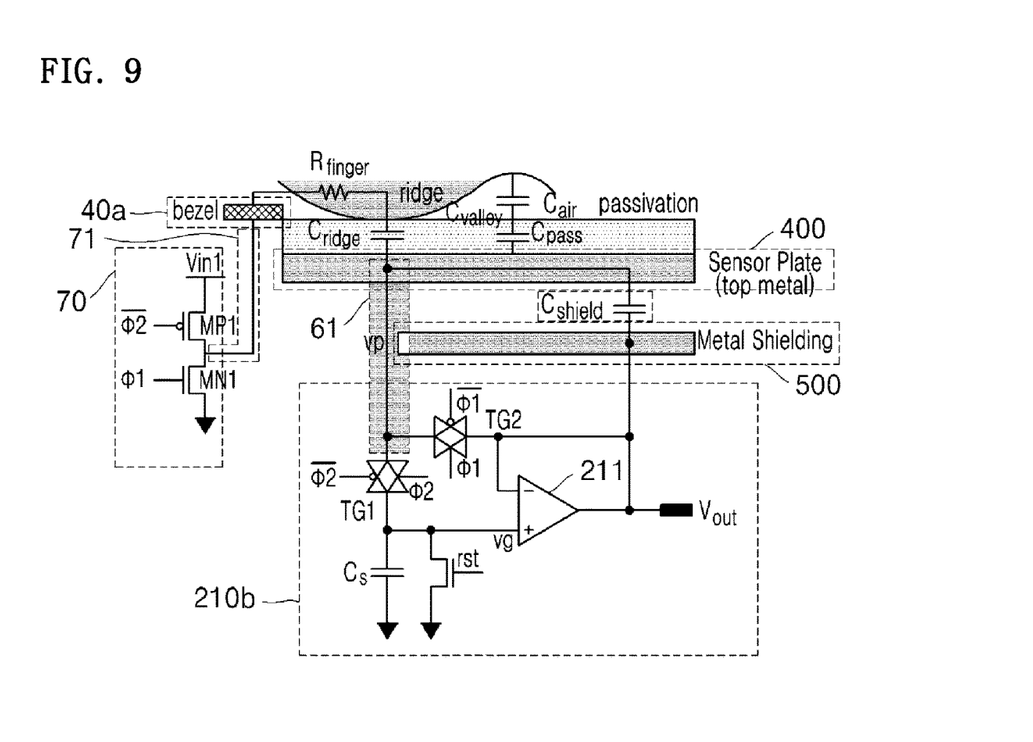
FIG. 9 is a schematic diagram illustrating a situation in which the charge transfer circuit for capacitive sensing of FIG. 6 is used in the fingerprint recognition device based on the direct method of FIG. 1.

FIG. 9 is a schematic diagram illustrating a situation in which the charge transfer circuit 200b for capacitive sensing of FIG. 6 is used in the fingerprint recognition device 1a based on the direct method of FIG. 1. The same elements as described above are referred to by the same reference numerals, and detailed descriptions of the same elements are omitted below.

The active output voltage feedback unit 210b is operated in the same manner as described above with reference to FIG. 6. That is, when the first clock signal Φ1 is at a high level at which the first switch MP1 and the fourth switch TG2 are turned on, the parasitic capacitor Cshield may be charged such that the voltage vp of the drive line 61 is equalized to the input terminal voltage vg of the buffer circuit by a feedback output voltage generated by the voltage follower of the input terminal of the buffer circuit including the operational amplifier 211. Therefore, the parasitic capacitor Cshield may be removed.

Figure 10:
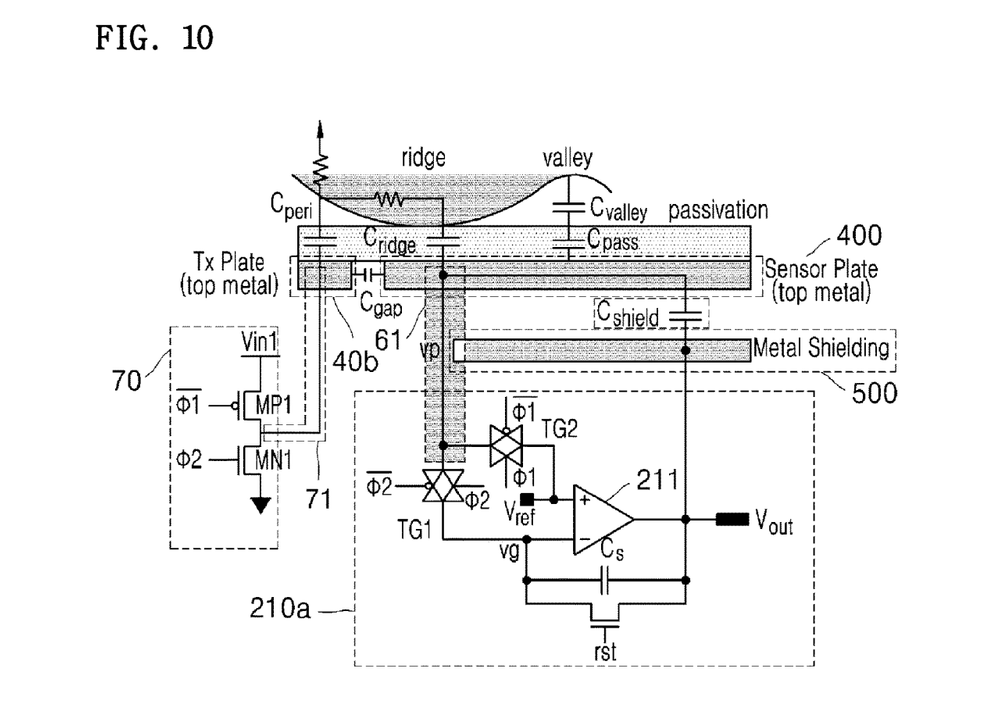
FIG. 10 is a schematic diagram illustrating a situation in which the charge transfer circuit for capacitive sensing of FIG. 5 is used in the fingerprint recognition device based on a pseudo-direct method of FIG. 2.

FIG. 10 is a schematic diagram illustrating a situation in which the charge transfer circuit 200a for capacitive sensing of FIG. 5 is used in the fingerprint recognition device 1b based on the pseudo-direct method of FIG. 1. The same elements as described above are referred to by the same reference numerals, and detailed descriptions of the same elements are omitted below.

The fingerprint recognition device 1b illustrated in FIG. 10 is different from the fingerprint recognition device 1a in that an electrode for transferring the power input signal Vin1 or Vin2 is replaced with the Tx plate 40b which is a top metal of a chip, whereas the bezel 40a is used as an electrode in the fingerprint recognition device 1a. As described above, the method in which a finger is allowed to contact a Tx plate through a passivation layer so as to perform an operation is referred to as the pseudo-direct method.

Here, a passivation layer capacitor Cperi may be generated due to a passivation layer between a Tx plate 300b and a finger. As illustrated in FIG. 10, the passivation layer capacitor Cperi may be connected to the capacitor Cfinger and a ground node through a finger and a resistor.

Therefore, the passivation layer capacitor Cperi may be connected in series to the finger capacitor Cfinger, and a total capacitance Ctotal may be expressed as an equation as below.

$$C_{total} = \frac{C_{peri}C_{finger}}{C_{peri} + C_{finger}} \quad \text{(Equation 9)}$$

It may be understood that the total capacitance Ctotal generally follows the finger capacitor Cfinger on the assumption that the value of the passivation layer capacitor Cperi is larger than that of the finger capacitor Cfinger. If the size of the Tx plate is sufficiently larger than the sensor cell size, a change of the finger capacitor Cfinger due to the passivation layer capacitor Cperi may be substantially ignored. Furthermore, since the pseudo-direct method of the present disclosure is based on an active output voltage feedback integrator, a voltage output range may be an entire interval of a power supply voltage.

Figure 11:
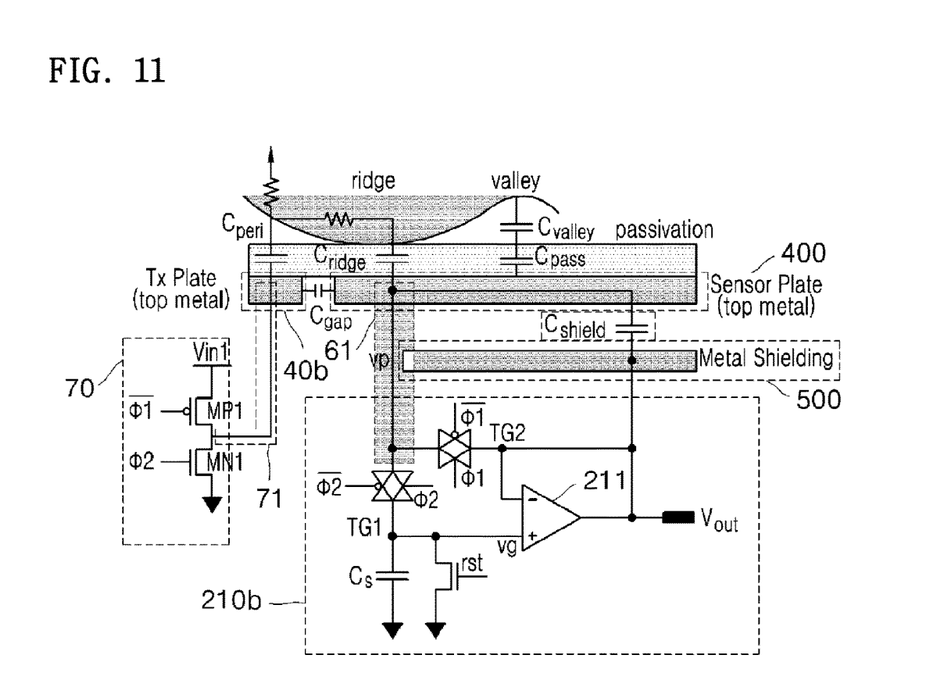
FIG. 11 is a schematic diagram illustrating a situation in which the charge transfer circuit for capacitive sensing of FIG. 6 is used in the fingerprint recognition device based on the pseudo-direct method of FIG. 2.

FIG. 11 is a schematic diagram illustrating a situation in which the charge transfer circuit 200b for capacitive sensing of FIG. 6 is used in the fingerprint recognition device 1b based on the pseudo-direct method of FIG. 1.

The same elements as described above are referred to by the same reference numerals, and detailed descriptions of the same elements are omitted below.

Since the pseudo-direct method is used, the Tx plate 40b which is a top metal transfers the power input signal Vin1 or Vin2 to a finger contacted via a passivation layer, unlike the method in which a bezel is used as an electrode. The circuit operation is the same as described above with reference to FIG. 6.

Figure 12:
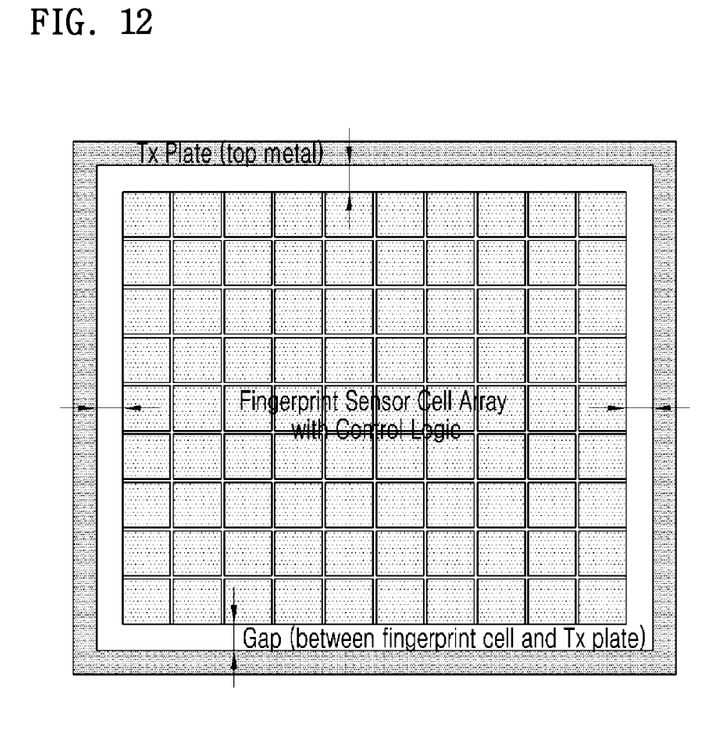
FIG. 12 is a layout top-view of the fingerprint recognition device based on the pseudo-direct method of FIG. 1.

FIG. 12 is a layout top-view of the fingerprint recognition device based on the pseudo-direct method of FIG. 2.

The Tx plate which is a top metal surrounds the exterior of a chip. The Tx plate may be spaced apart from a sensor cell block such that a gap capacitor Cgap is sufficiently small, thereby preventing an input signal applied to a Tx electrode from being directly transferred to a sensor cell array. This gap may be appropriately adjusted according to a thickness of the passivation layer. The Tx plate which is a top metal surrounds the exterior of a chip. The Tx plate may be spaced apart from a sensor cell block such that a gap capacitor Cgap is sufficiently small, thereby preventing an input signal applied to a Tx electrode from being directly transferred to a sensor cell array. This gap may be appropriately adjusted according to a thickness of the passivation layer. As an embodiment, the top metal may be disposed under a passivation layer, and may be spaced apart from another top metal so that the one end of the top metal may be connected to the one end of the X-drive line and the other end of the top metal is contactable by the finger through the passivation layer. In more detail, referring to FIGS. 7A and 7B, the top metal of the present disclosure may include a Tx plate of which one end is connected to the one end of the X-drive line and of which another end is connected to the passivation layer so as to transfer a driving signal of the X-drive line to the finger through the passivation layer and a sensor plate spaced apart from the Tx plate by a predetermined distance.

The invention claimed is:

1. A charge transfer circuit for capacitive sensing, the charge transfer circuit comprising:
    a variable capacitor defined through a sensor plate connected to one end of a drive line and one end of an X-drive line;
    an X-drive part disposed between a voltage input terminal and another end of the X-drive line opposing the variable capacitor;
    a shielding plate disposed under the sensor plate to block a noise generated by a circuit under the sensor plate;
    a buffer circuit unit configured to feed an output terminal of an operational amplifier back to an inverting input terminal of the operational amplifier; and
    an active output voltage feedback unit comprising the buffer circuit unit and disposed between a voltage output terminal and another end of the drive line of which the one end is connected to the variable capacitor,
    wherein one end of the shielding plate is connected to an output terminal of the active output voltage feedback unit to which an output terminal of the buffer circuit unit is connected in order to remove a parasitic capacitor generated between the sensor plate and the shielding plate,
    wherein the output terminal of the active output voltage feedback unit opposing the one end of the drive line is connected to the other end of the drive line.

2. The charge transfer circuit of claim 1, wherein the active output voltage feedback unit comprises:
    a third switch and a fourth switch connected in parallel to the other end of the drive line;

a storage capacitor of which one terminal is connected between one terminal of the third switch and an input terminal of the buffer circuit unit and of which another terminal is grounded; and a reset switch of which one terminal is connected to the one terminal of the third switch, the input terminal of the buffer circuit unit, and the storage capacitor and of which another terminal is grounded, wherein the output terminal of the buffer circuit unit opposing the third switch is connected to the other end of the drive line, wherein the buffer circuit unit comprises the operational amplifier, wherein a non-inverting input terminal of the operational amplifier is connected to the one terminal of the third switch opposing the drive line and the inverting input terminal of the operational amplifier is connected between the output terminal of the operational amplifier and the fourth switch.

3. The charge transfer circuit of claim 2, wherein the third switch is turned off by a first clock signal and turned on by a second clock signal, and wherein the fourth switch is turned on by the first clock signal and turned off by the second clock signal.

4. The charge transfer circuit of claim 2, wherein the third switch is turned off by a second clock bar signal and turned on by a first clock bar signal, and wherein the fourth switch is turned on by the second clock bar signal and turned off by the first clock bar signal.

5. The charge transfer circuit of claim 1, wherein the X-drive part comprises:

a first switch configured to be turned on by a first clock signal or a second clock bar signal and turned off by a second clock signal or a first clock bar signal; and a second switch configured to be turned on by the second clock signal or the first clock bar signal and turned off by the first clock signal or the second clock bar signal, wherein the first clock signal and the second clock signal do not overlap each other.

6. A fingerprint recognition device comprising:

a charge transfer circuit for capacitive sensing; and a bezel;

wherein the charge transfer circuit comprises:

a variable capacitor defined through a sensor plate connected to one end of a drive line and one end of an X-drive line;

an X-drive part disposed between a voltage input terminal and another end of the X-drive line opposing the variable capacitor;

a buffer circuit unit in which an inverting input terminal and an output terminal of an operational amplifier are connected to each other;

an active output voltage feedback unit comprising the buffer circuit unit and disposed between a voltage output terminal and another end of the drive line of which the one end is connected to the variable capacitor; and a shielding plate disposed under the sensor plate to block a noise generated by a circuit under the sensor plate, wherein one end of the shielding plate is connected to an output terminal of the active output voltage feedback unit to which an output terminal of the buffer circuit unit is connected in order to remove a parasitic capacitor generated between the sensor plate and the shielding plate, wherein the output terminal of the active output voltage feedback unit opposing the one end of the drive line is connected to the other end of the drive line, wherein one end of the bezel is connected to the one end of the X-drive line and another end of the bezel is directly contactable by a finger.

7. A fingerprint recognition device comprising:

a charge transfer circuit for capacitive sensing; and a top metal, wherein the charge transfer circuit comprises:

a variable capacitor defined through a sensor plate connected to one end of a drive line and one end of an X-drive line;

an X-drive part disposed between a voltage input terminal and another end of the X-drive line opposing the variable capacitor;

a switched capacitor integrator disposed between a voltage output terminal and another end of the drive line of which the one end is connected to the variable capacitor; and a shielding plate connected to a first input terminal of the switched capacitor integrator, wherein the first input terminal is connected to the other end of the drive line, wherein the top metal is disposed under a passivation layer and connects a finger to the X-drive line through the passivation layer, wherein the top metal comprises a Tx plate of which one end is connected to the one end of the X-drive line and of which another end is connected to the passivation layer so as to transfer a driving signal of the X-drive line to the finger through the passivation layer, wherein the Tx plate is spaced apart from the sensor plate by a predetermined distance.

8. A fingerprint recognition device comprising:

a charge transfer circuit for capacitive sensing; and a top metal, wherein the charge transfer circuit comprises:

a variable capacitor defined through a sensor plate connected to one end of a drive line and one end of an X-drive line;

an X-drive part disposed between a voltage input terminal and another end of the X-drive line opposing the variable capacitor;

a buffer circuit unit in which an inverting input terminal and an output terminal of an operational amplifier are connected to each other;

an active output voltage feedback unit comprising the buffer circuit unit and disposed between a voltage output terminal and another end of the drive line of which the one end is connected to the variable capacitor; and a shielding plate connected to an output terminal of the active output voltage feedback unit, wherein the output terminal of the active output voltage feedback unit opposing the one end of the drive line is connected to the other end of the drive line, wherein the top metal is disposed under a passivation layer and connects a finger to the X-drive line through the passivation layer, wherein the top metal comprises a Tx plate of which one end is connected to the one end of the X-drive line and of which another end is connected to the passivation layer so as to transfer a driving signal of the X-drive line to the finger through the passivation layer, wherein the Tx plate is spaced apart from the sensor plate by a predetermined distance.

9. The fingerprint recognition device of claim 6, wherein the X-drive part comprises:
- a first switch configured to be turned on by a first clock signal or a second clock bar signal and turned off by a second clock signal or a first clock bar signal; and
- a second switch configured to be turned on by the second clock signal or the first clock bar signal and turned off by the first clock signal or the second clock bar signal,
- wherein the first clock signal and the second clock signal do not overlap each other.

10. The fingerprint recognition device of claim 6, wherein the active output voltage feedback unit comprises:
- a third switch and a fourth switch connected in parallel to the other end of the drive line;
- a storage capacitor of which one terminal is connected between one terminal of the third switch and an input terminal of the buffer circuit unit and of which another terminal is grounded; and
- a reset switch of which one terminal is connected to the one terminal of the third switch, the input terminal of the buffer circuit unit, and the storage capacitor and of which another terminal is grounded,
- wherein the output terminal of the buffer circuit unit opposing the third switch is connected to the other end of the drive line,
- wherein the buffer circuit unit comprises the operational amplifier,
- wherein a non-inverting input terminal of the operational amplifier is connected to the one terminal of the third switch opposing the drive line and the inverting input terminal of the operational amplifier is connected between the output terminal of the operational amplifier and the fourth switch.

11. The fingerprint recognition device of claim 10,
- wherein the third switch is turned off by a first clock signal or a second clock bar signal and is turned on by a second clock signal or a first clock bar signal,
- wherein the fourth switch is turned on by the first clock signal or the second clock bar signal and is turned off by the second clock signal or the first clock bar signal,
- wherein the first clock signal and the second clock signal do not overlap each other.

* * * * *